United States Patent [19]

Yamaguchi et al.

[11] Patent Number: 5,468,697
[45] Date of Patent: Nov. 21, 1995

[54] COMPOSITE ULTRAFINE PARTICLES OF ALUMINUM NITRIDE AND RARE EARTH NITRIDE, METHOD FOR PRODUCTION AND SINTERED ARTICLE THEREOF

[75] Inventors: Tadashi Yamaguchi, Sendai; Katsutoshi Nosaki, Wako; Akihisa Inoue, 11-806, Kawauchijutaku, Mubanchi, Kawauchi; Tsuyoshi Masumoto, 3-8-22, Kamisugi, both of Aoba-ku, Sendai-shi, Miyagi-ken, all of Japan

[73] Assignees: Yoshida Kogyo K.K., Tokyo; Tsuyoshi Masumoto; Akihisa Inoue, both of Miyagi; Honda Giken Kogyo Kabushiki Kaisha, Tokyo, all of Japan

[21] Appl. No.: 212,864

[22] Filed: Mar. 15, 1994

[30] Foreign Application Priority Data

Mar. 16, 1993 [JP] Japan ................................ 5-080325
Mar. 16, 1993 [JP] Japan ................................ 5-080326
Sep. 8, 1993 [JP] Japan ................................ 5-246063

[51] Int. Cl.$^6$ ................................................ C04B 35/581
[52] U.S. Cl. ................................................ 501/98; 423/412
[58] Field of Search .......................... 501/96, 98; 423/412

[56] References Cited

U.S. PATENT DOCUMENTS

| | | | |
|---|---|---|---|
| 4,322,395 | 3/1982 | McHenry et al. | 423/412 |
| 4,642,207 | 2/1987 | Uda et al. | 264/10 |
| 4,680,278 | 7/1987 | Inoue et al. | 501/98 |
| 4,689,075 | 8/1987 | Uda et al. | |
| 5,164,263 | 11/1992 | Bolt et al. | 423/412 X |
| 5,182,239 | 1/1993 | Hirokawa et al. | 501/98 |
| 5,273,699 | 12/1993 | Knudsen et al. | 501/98 X |

FOREIGN PATENT DOCUMENTS

| | | |
|---|---|---|
| 0317771 | 6/1990 | European Pat. Off. |
| 62-283805 | 12/1987 | Japan. |
| 62-282635 | 12/1987 | Japan. |
| 63-17210 | 1/1988 | Japan. |
| 63-156007 | 6/1988 | Japan. |
| 402030608 | 2/1990 | Japan ................... 423/412 |
| 1675201 | 9/1991 | U.S.S.R. ................. 423/412 |

OTHER PUBLICATIONS

"Production of ultrafine aluminum and aluminum nitride particles by plasma-alloy reaction and their microstructure and morphology", J. Appl. Phys. 71 (8), Apr. 15, 1992, pp. 4025–4029.

Primary Examiner—Karl Group
Attorney, Agent, or Firm—Finnegan, Henderson, Farabow, Garrett & Dunner

[57] ABSTRACT

Ultrafine particles of aluminum nitride having a morphologically anisotropic structure of columns, plates, or whiskers such that the ratio of thickness or width to length or the ratio of thickness to width or length of particle is not less than 1 are produced by thermally melting a binary alloy of metallic aluminum and a rare earth element in a nitriding atmosphere containing nitrogen. By this method are produced composite ultrafine particles which substantially comprise ultrafine particles of aluminum nitride having the morphologically anisotropic structure and ultrafine particles of the rare earth nitride which functions as a sintering auxiliary therefor. The composite ultrafine particles or an aggregate thereof are usable as a raw material for the production of a sintered article, a reinforcing material for various metal-based composite materials, a blast powder, and the like.

9 Claims, 10 Drawing Sheets

COMPOSITE ULTRAFINE PARTICLES OF ALUMINUM NITRIDE AND RARE EARTH NITRIDE, METHOD FOR PRODUCTION AND SINTERED ARTICLE THEREOF

BACKGROUND OF THE INVENTION

1. Field of the Invention

This invention relates to morphologically anisotropic ultrafine particles of aluminum nitride having the form of columns, plates, or whiskers, a method for the production thereof, and a sintered article obtained by sintering a powder containing the ultrafine particles of aluminum nitride mentioned above. More particularly, the present invention relates to composite ultrafine particles comprising morphologically anisotropic ultrafine particles of aluminum nitride and ultrafine particles of rare earth nitride, which are usable as a raw material for the production of a sintered article, a reinforcing material for various metal-based composite materials, a blast powder, and the like.

2. Description of the Prior Art

The sintered articles of aluminum nitride enjoy resistance to heat, high thermal conductivity, high electrical insulating quality, and light transmission properties and, by virtue of these features, find extensive utility in various applications as to heat-releasing substrates for semiconductors, printed circuit boards, packaging materials for LSI (large scale integrated circuit), light-pervious hear-resistant materials, and the like. Though these sintered articles of aluminum nitride are commonly produced by sintering aluminum nitride powder, the properties of the produced sintered articles are affected largely by the purity and particle diameter of a particular powder used as the raw material and further by the purity, particle diameter, and manner or mixture of a sintering auxiliary to be added to the raw material. For tile purpose or obtaining a sintered article of high performance, it is necessary that the aluminum nitride powder to be used should possess high purity and fineness and the sintering auxiliary powder to be additionally used should possess high purity and fineness and should be mixed uniformly with the aluminum nitride powder.

As concrete examples of the methods heretofore used for the production of aluminum nitride powder, the following methods may be cited:

(1) a method which comprises directly nitriding metallic aluminum and then finely pulverizing the resultant aluminum nitride, (2) a method which comprises reducing aluminum oxide powder with carbon of high purity and meanwhile nitriding the resultant reduction product by reaction with nitrogen, (3) a method which comprises attaining vapor-phase synthesis of aluminum nitride powder by utilizing the reaction of an aluminum halide with ammonia, and (4) a method which comprises melting metallic aluminum with arc or plasma in an atmosphere of a mixed gas of nitrogen and ammonia thereby preparing a mixture of ultrafine particles of metallic aluminum and aluminum nitride and then heating the ultrafine particles at a high temperature in an atmosphere of nitrogen thereby nitriding ultrafine particles of metallic aluminum (see Japanese Patent Applications, KOKAI (Early Publication) No. 62-283,805 and No. 62-282,635).

The methods (1) and (2) mentioned above, however, do not easily produce aluminum nitride powder having a particle size of not more than 1 μm and the method (3) mentioned above is at a disadvantage in obtaining aluminum nitride powder of high purity only with difficulty. The method (4) mentioned above has the problem of being incapable of obtaining a sintered article of aluminum nitride of high performance because the produced particles are not wholly nitrided and further because the ultrafine particles of metallic aluminum which have escaped being nitrided are extremely active and induce ignition or oxidation on exposure to even a small amount of oxygen. Further, the aluminum nitride particles obtained by the four methods mentioned above have relatively isotropic forms such as hexagons or spheres. When these particles are manufactured into a the sintered article or they are used as a reinforcing material in the production of a composite material having a metallic matrix, the sintered article or the composite material has room for further improvement in strength, particularly hot strength.

SUMMARY OF THE INVENTION

The present invention, therefore, is intended to realize production of ultrafine particles of aluminum nitride possessing morphological anisotropy and thereby attain manufacture of a sintered article or a metallic matrix composite material excelling in hot strength by the use of the ultrafine particles of aluminum nitride.

To be specific, a primary object of the present invention is to discover the composition of a raw material and the conditions for producing morphologically anisotropic ultrafine particles of aluminum nitride in the form of columns, plates, or whiskers.

In addition thereto, the present invention is intended to simultaneously accomplish the requirement that the sintering auxiliary should be uniformly mixed with the aluminum nitride powder for the manufacture of a sintered article of aluminum nitride. Another object of the present invention, therefore, is to provide composite ultrafine particles which comprise aluminum nitride and a sintering auxiliary and permit themselves to be sintered without any modification.

A further object of the present invention is to provide composite ultrafine particles or an aggregate or deposit thereof which comprise aluminum nitride and a sintering auxiliary and permit themselves to be directly sintered and, at the same time, confer anisotropy on the shape of aluminum nitride particles and thereby attain manufacture of a sintered article or a metallic matrix composite material excelling in hot strength by the use of the composite ultrafine particles or the aggregate thereof.

Yet another object of the present invention is to provide a method capable of vapor-phase production of composite ultrafine particles which comprise ultrafine particles of aluminum nitride and a sintering auxiliary uniformly mixed and which contain no ultrafine metallic aluminum particles.

Still another object of the present invention is to provide a method for producing ultrafine particles of aluminum nitride which permit variation of the volumetric ratio of morphologically anisotropic ultrafine particles of aluminum nitride by controlling the composition of alloy to be used as a raw material and the nitriding atmosphere containing nitrogen and, in consequence of the use of this method, provide ultrafine particles of aluminum nitride which are advantageously usable for the manufacture of a sintered article or a metallic matrix composite material manifesting high performance.

A still further object of the present invention is to provide a sintered article of high performance with high sintering efficiency and at a low cost by the use of such composite ultrafine particles of aluminum nitride and a sintering auxiliary as mentioned above.

In accordance with the present invention, to accomplish the objects described above, there is provided a method for the production of ultrafine particles of aluminum nitride, comprising the steps of: providing a raw material comprising at least a binary alloy of aluminum with a rare earth element as an additive element, thermally melting the raw material in a nitriding atmosphere containing nitrogen and causing the resultant vaporized aluminum to react with the nitrogen in the nitriding atmosphere thereby producing ultrafine particles of aluminum nitride.

By this method are produced ultrafine particles of aluminum nitride having the morphologically anisotropic structure like columns, plates, or whiskers such that the ratio of thickness or width to length or the ratio of thickness to width or length of the individual particles exceeds 1. By suitably selecting the composition of the binary alloy mentioned above and the pressure or partial pressure of nitrogen in the nitriding atmosphere, there can be produced composite ultrafine particles which comprise ultrafine particles of aluminum nitride including morphologically anisotropic ultrafine particles in the shape of hexagonal columns, strips, or whiskers and ultrafine particles of a rare earth nitride, i.e. a sintering auxiliary for the aluminum nitride, and contain substantially no ultrafine particles of metallic aluminum.

The aggregate or deposit of composite ultrafine particles which are produced as described above can be directly used as a sintering material and can be sintered to produce a sintered article of high performance.

BRIEF DESCRIPTION OF THE DRAWINGS

Other objects, features, and advantages of the invention will become apparent from the following description taken together with the drawings, in which.

DETAILED DESCRIPTION OF THE INVENTION

The present inventors, after a dilligent study continued with a view to accomplishing the objects mentioned above, have found that when a nitriding atmosphere formed exclusively of nitrogen gas is used and a metallic aluminum-rare earth element binary alloy is used as a matrix alloy to be melted as by an electric arc in the production of mixtured ultrafine particles of metallic aluminum and aluminum nitride by melting an aluminum alloy as by the arc melting, the production of ultrafine particles proceeds at a sharply increased nitriding ratio and give rise to ultrafine particles of aluminum nitride containing a rare earth element or the nitride of rare earth element and having such a columnar or platelike structure that the ratio of thickness or width to length or the ratio of thickness to width or length (hereinafter collectively referred to as an "aspect ratio") of the particles is not less than 1. They have further found that when the composition of the binary alloy mentioned above and the pressure or partial pressure of nitrogen in the nitriding atmosphere are suitably selected, morphologically anisotropic ultrafine aluminum nitride particles of the shape of hexagonal columns, strips, or whiskers are produced together with ultrafine particles of the nitride of the rare earth element which functions as a sintering auxiliary for aluminum nitride and composite ultrafine particles having the ultrafine aluminum nitride particles and the ultrafine rare earth nitride particles uniformly mixed and containing substantially no ultrafine metallic aluminum particles are produced.

To be specific, the present invention is directed to a method of producing ultrafine particles by melting an aluminum alloy as by an electric arc, which method is characterized by using a binary alloy of metallic aluminum and a rare earth element as a matrix alloy to be melted and further using a nitriding atmosphere exclusively formed of nitrogen gas thereby effecting vapor-phase production of composite ultrafine particles composed of ultrafine particles of aluminum nitride including ultrafine particles of the shape of hexagonal columns, strips, or whiskers uniformly mixed with ultrafine particles of the nitride of a rare earth element which functions as a sintering auxiliary therefor.

As concrete examples of the method which can be used for fulfilling tile thermal melting mentioned above, the arc melting method, high-frequency thermal melting method, plasma jet heating method, high-frequency induction heating (high-frequency plasma heating) method, electron beam heating method, and laster beam heating method may be cited.

The composite ultrafine particles which are obtained by the method of the present invention can be directly sintered by various pressure sintering methods because they consist of ultrafine particles of aluminum nitride including ultrafine particles in the form of hexagonal columns, strips, or whiskers and ultrafine particles of tile nitride of a rare earth element, a sintering auxiliary therefor, and contain substantially no ultrafine particles of metallic aluminum. The ultrafine particles of aluminum nitride produced copiously contain ultrafine particles of the shape of hexagonal columns or whiskers (measuring 5 to 200 nm in thickness or width and 50 to 1,000 nm in length) or ultrafine particles of the shape of strips (measuring 5 to 50 nm in thickness and 10 to 1,000 nm in width or length) and enjoy exceptional fineness and excel in the sintering property. Further, since the ultrafine particles of aluminum nitride have the shape of columns, whiskers, or plates, they can be sintered at an exalted density. By sintering the composite ultrafine particles mentioned above, therefore, a sintered article of high strength and high performance can be produced with high productivity.

The particles of the shape of hexagonal columns or strips comprise aluminum nitride containing approximately 2 to 25 atomic % of a rare earth element in the form of solid solution or rare earth nitride particles and showing a direction of growth in the c axis of the crystals (hexagonal) of aluminum nitride. The mechanism of the growth of the particles showing such morphological anisotropy as mentioned above remains yet to be elucidated. The fact that this morphological anisotropy is not observed in the ultrafine particles produced from metallic aluminum alone and the fact that the ultrafine particles contain a rare earth element in the form of solid solution or nitride particles are believed to imply definitely that the growth in the direction of the a axis is repressed or the growth in the direction of the c axis is accelerated.

The ultrafine particles in the shape of whiskers are single crystals of aluminum nitride. They are suspected to assume the shape of whiskers because the growth thereof is conspicuously promoted in the direction of the c axis of aluminum nitride crystals. This growth of ultrafine particles of aluminum nitride in the shape of whiskers is observed when the alloy of aluminum and rare earth element except for samarium, europium, and ytterbium is used as a raw material.

The binary alloys which are effectively usable in the present invention are combinations of metallic aluminum with such rare earth elements as yttrium (Y), lanthanum (La), cerium (Ce), neodymium (Nd), scandium (Sc), gadolinium (Gd), and terbium (Tb). The ultrafine particles of aluminum nitride to be produced are observed to vary slightly in structure, depending on the kind of rare earth element to be used. When yttrium is adopted as a rare earth element, for example, ultrafine particles of the shape of columns, particularly hexagonal columns, of a composite phase of aluminum nitride and yttrium nitride can be produced by suitably selecting the ratio of metallic aluminum and yttrium in the matrix alloy. When other rare earth element is adopted instead, a mixture of ultrafine particles of aluminum nitride in the shape of plates or columns or hexagonal columns with ultrafine particles of the rare earth nitride in the shape of plates or grains is liable to occur. Then, the ultrafine particles of aluminum nitride in the shape of whiskers tend to form particularly when neodymium, lanthanum, cerium, etc. are adopted as the rare earth element.

In any case, however, composite ultrafine particles containing substantially no ultrafine particle of metallic aluminum are produced by selecting the composition of the aforementioned binary alloy so that the proportion of aluminum falls in the range of 10 to 60 atomic percentages and that of the rare earth element in the range of 40 to 90 atomic percentages. The composite ultrafine particles which are produced as described above can be used directly as a raw material for the production of sintered articles of high strength and high performance because they contain both morphologically anisotropic ultrafine particles of aluminum nitride and ultrafine particles of the nitride of a rare earth element serving as a sintering auxiliary therefor. Further, the morphological anisotropy of ultrafine particles of aluminum nitride to be produced can be controlled by varying the composition of the alloy within the range specified above. When the proportion of the rare earth element is high, for example, the produced ultrafine particles are liable to assume the shape of columns or whiskers. If the aluminum content of the alloy is less than 10 atomic %, tile sintered articles to be eventually manufactured from tile produced ultrafine particles will fail to acquire desirable quality because of insufficient supply of aluminum nitride. Conversely, if the aluminum content exceeds 60 atomic %, the produced ultrafine particles will have the disadvantage of inevitably containing ultrafine particles of metallic aluminum which has escaped being nitrided. Particularly preferable range of the alloy composition is such that the proportion of aluminum falls in the range of 20 to 60 atomic % and that of the rare earth element in the range of 40 to 80 atomic %.

When a binary alloy of metallic aluminum and yttrium is used as a matrix alloy, the alloy is desired to have such a composition that the proportion of aluminum is in the range of 20 to 60 atomic % and that of yttrium in the range of 40 to 80 atomic %. As a result, composite ultrafine particles substantially having a composite phase of aluminum nitride and yttrium nitride and containing particles in the shape of hexagonal columns or strips as described above are produced.

Incidentally, the matrix alloy is desired to be prepared in an atmosphere of an inert gas before it is melted in the atmosphere of nitrogen. Optionally, however, this matrix alloy may be melted in a vacuum within the same vessel that is to be used subsequently for melting the alloy in the atmosphere of nitrogen or it may be melted in a separate vacuum vessel before it is melted in the atmosphere of nitrogen.

When the ultrafine particles having such a morphologically anisotropic structure as described above are used for the production of a sintered article or a metal-based composite material, the individual ultrafine particles will assume an intertwined form which contributes to exaltation of the strength of the products. For the sake of ensuring manifestation of such an effect as described above, it is necessary that a sintered article of ultrafine particles should be manufactured by sintering ultrafine particles which comprise aluminum nitride and the nitride of a rare earth element and contain at least 5% by volume of morphologically anisotropic ultrafine particles of aluminum nitride as mentioned above.

The volumetric proportion of the morphologically anisotropic ultrafine particles in the produced ultrafine particles can be controlled by varying the composition of the binary alloy of metallic aluminum and a rare earth element so that the proportion of aluminum falls in the range of 10 to 60 atomic % and that of the rare earth element in the range of 40 to 90 atomic % or by varying the pressure of the atmosphere formed solely of nitrogen gas or the partial pressure of nitrogen gas in a nitriding atmosphere in the range of 20 to 100 kPa.

Since the composite ultrafine particles or the aggregate thereof according to the present invention comprise ultrafine particles of aluminum nitride including morphologically anisotropic ultrafine particles of the shape of substantially hexagonal columns, strips, or whiskers and ultrafine particles of the nitride of a rare earth element which functions as a sintering auxiliary therefor, they can be directly sintered at an exalted density by various pressure sintering methods and can be used as an ideal reinforcing material for various metal-based composite materials. The sintered articles and the composite materials to be obtained by the use of these composite ultrafine particles exhibit outstanding properties particularly at high temperatures and possess resistance to heat, high thermal conductivity, high electrical insulating quality, and light transmission properties. Thus, they can be advantageously used in a wide range of applications such as, for example, heat-releasing substrates for semiconductors, printed circuit boards, packaging materials for LSI, and light-pervious heat-resistant materials. Further, since the composite ultrafine particles according to the present invention comprise ultrafine particles of aluminum nitride and ultrafine particles of the nitride of a rare earth element which functions as a sintering auxiliary therefor, they can be used as a sintering accelerator which is to be mixed with an ordinary aluminum nitride powder for the purpose of promoting the phenomenon of sintering as in the interface therebetween. When the ultrafine particles of aluminum nitride are in the shape of whiskers, the addition thereof permits a produced sintered article to acquire further exalted strength. Since these whiskers of aluminum nitride manifest such a high decomposition temperature as about 2,200° C. which is peculiar to ultrafine particles of aluminum nitride, they can be utilized as a whisker dispersing material.

Furthermore, the ultrafine particles which are obtained by the present invention can be advantageously used (A) as a blast powder for fine fabrication of the surface of a varying substance and (B) for a novel process of fabrication to be used in the manufacture of a varying micromachine, for example, fabrication of substrates for electronic materials, fabrication of ultramicro parts, and fine surface treatments.

Since the ultrafine particles according to the present invention possess pointed ends, resemble bars in shape, and measure on the order of nanometers, they fit as a blast powder. These ultrafine particles can be spouted with a carrier gas of high pressure such as, for example, At, $N_2$, Ar+$N_2$ against a workpiece such as, for example, metallic, ceramic, and plastic substrates. They can be used for line fabrication of the order of micrometers by decreasing the diameter of the outlet orifice of the spouting nozzle. They even allow impartation of a desired pattern to the surface of a given substrate or permit insertion of a desired incision in a finely processed membrane deposited as a coating on a substrate. In the case of a substrate having a Cu coating formed on the surface of a ceramic substrate, for example, the part of the Cu coating from which a pattern is removed by the blasting (the etched part) can be used as an electrical insulating part. This particular fabrication is useful for the applications of the category (B) mentioned above.

Now, the present invention will be described more specifically below with reference to working examples.

Figure 1:
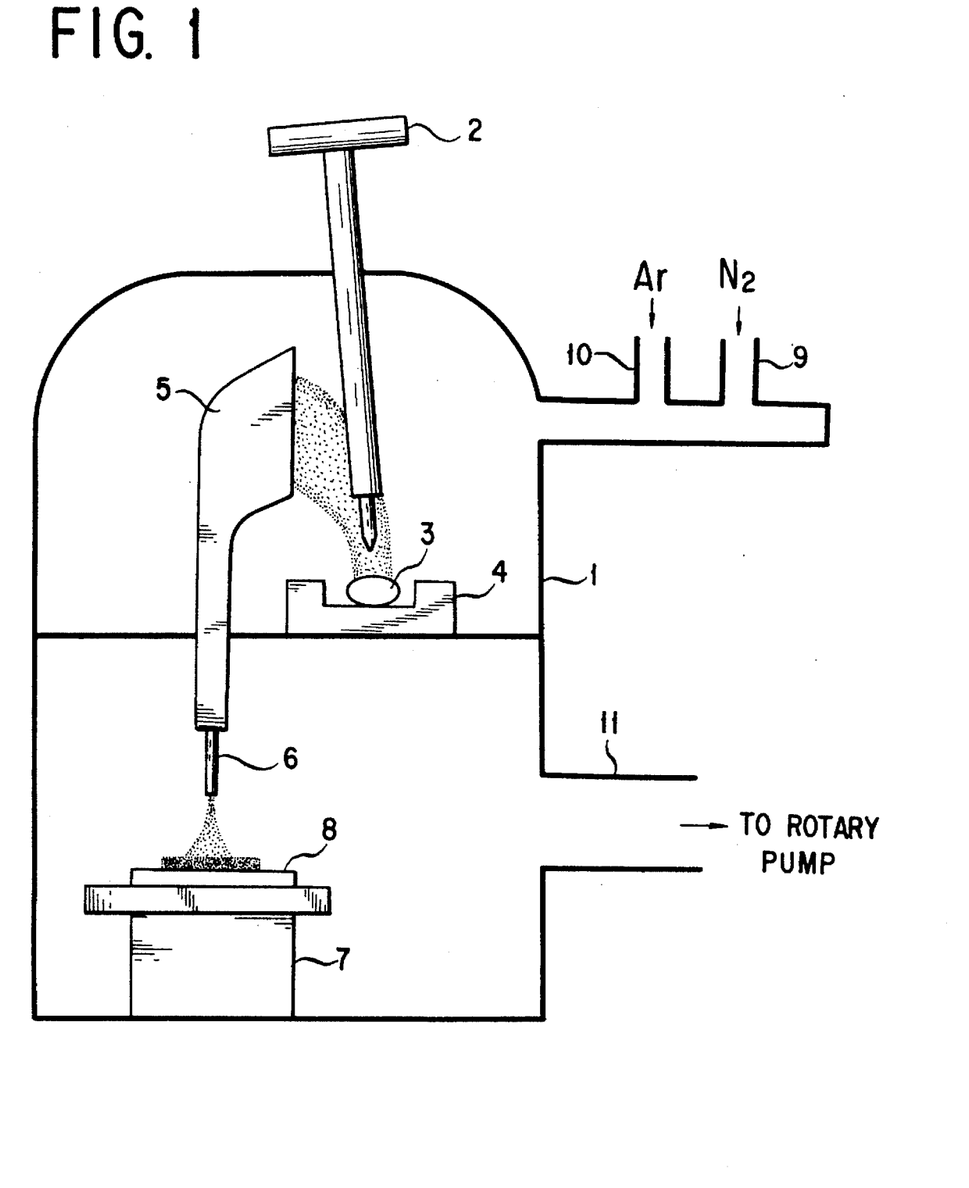
FIG. 1 is a schematic diagram of one example of the apparatus to be used for the production of composite ultrafine particles by arc melting in accordance with tile method of the present invention.

FIG. 1 is a schematic structural diagram illustrating one example of the apparatus for manufacturing composite ultrafine particles by the arc melting in accordance with the method of the present invention, as adopted in the following working examples. In FIG. 1, the reference numeral 1 stands for a vacuum vessel and 2 for an arc electric source. A matrix alloy 3 disposed in a hearth 4 inside the vacuum vessel 1 is melted by an electric arc and allowed to produce ultrafine particles. The ultrafine particles thus produced are collected by the stream of gas in a collection umbrella 5, forwarded through a nozzle 6, and deposited on a substrate 8 disposed on the upper side of a substrate stage part 7. The reference numerals 9, 10, and 11 respectively stand for a nitrogen gas inlet, an argon gas inlet, and a gas outlet.

EXAMPLE 1

Composite ultrafine particles comprising aluminum nitride and yttrium nitride were obtained by arc-melting (DC 200 A) a binary alloy of 50 atomic % metallic aluminum-50 atomic % metallic yttrium as a matrix alloy in an atmosphere formed exclusively of nitrogen gas. At this time, the arc melting of the alloy was carried out while supplying the nitrogen gas into the vacuum chamber at a flow rate of 10 liters per minute and the produced ultrafine particles were blown to the substrate by the stream of nitrogen gas through the nozzle and deposited thereon. The matrix alloy used in this case had been previously prepared by melting metallic aluminum and metallic yttrium by an electric arc and uniformly alloying the melted metals in an atmosphere of argon in the same vacuum chamber that was used subsequently in the production of ultrafine particles in the atmosphere of nitrogen.

Other kinds of ultrafine particles were also produced by following the procedure described above while using binary alloys of 25 at % Al-75 at % Y, 60 at % Al-40 at % Y, and 75 at % Al-25 at % Y instead respectively as well as metallic aluminum.

Figure 2:
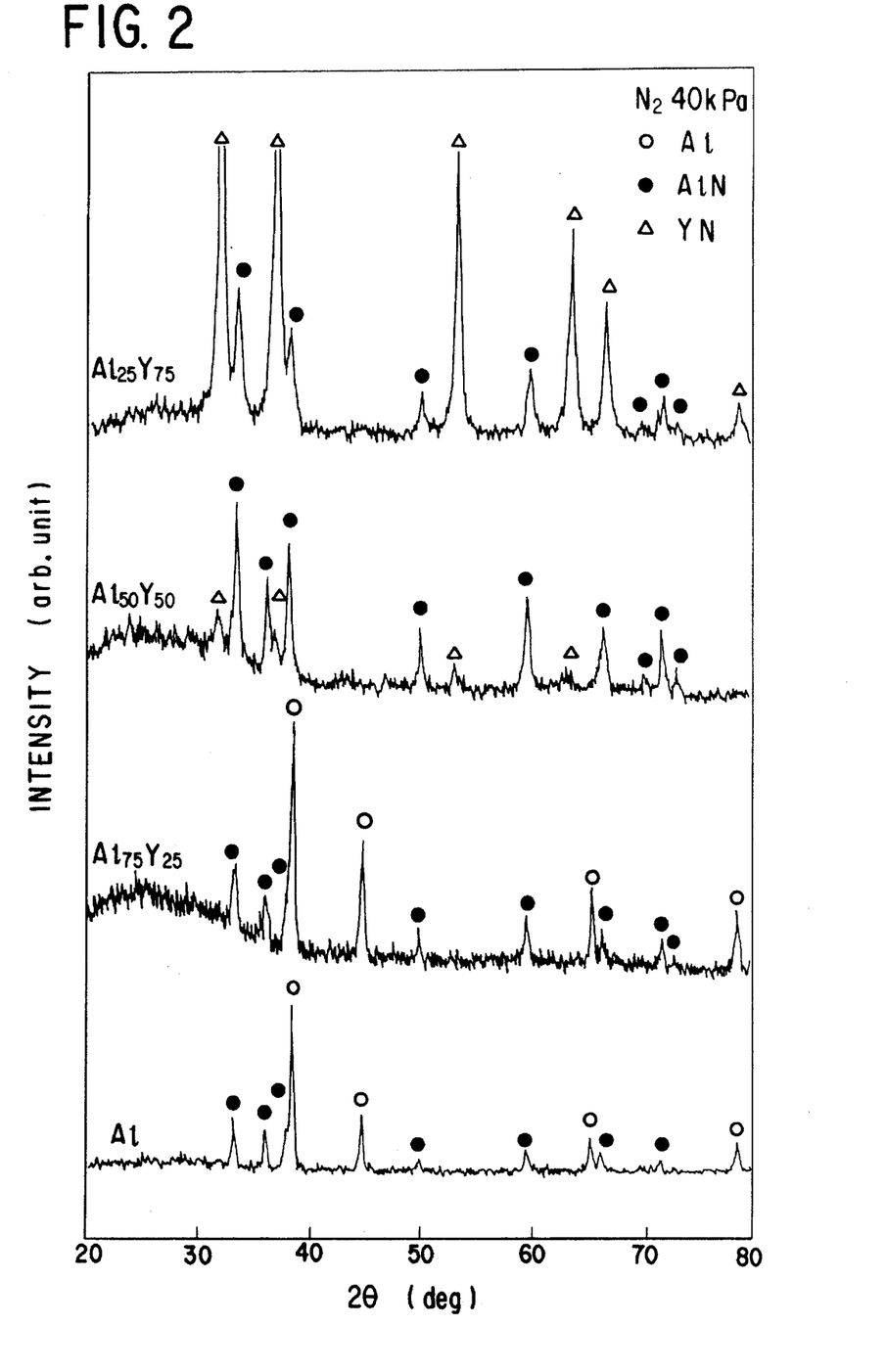
FIG. 2 is a diagram showing X-ray diffraction patterns of ultrafine particles produced by using aluminum-yttrium binary alloys in varying compositions and metallic aluminum, respectively.
Figure 3:
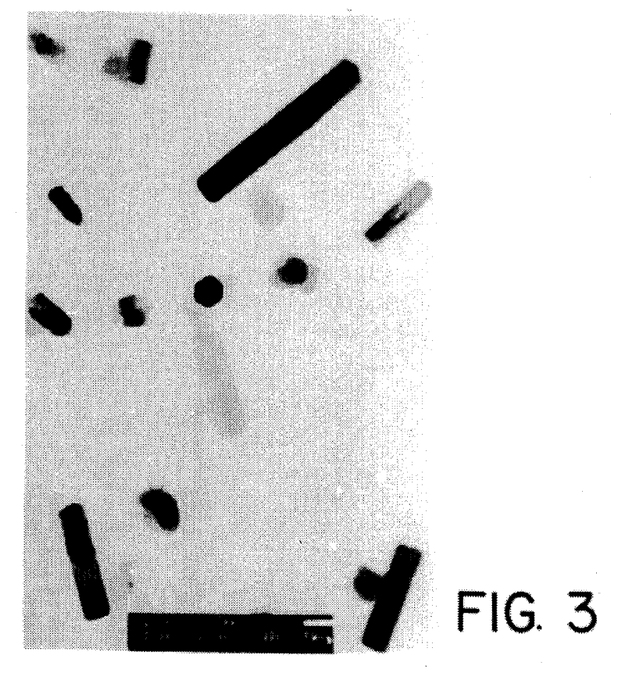
FIG. 3 is a transmission electron micrograph obtained at a first magnification of composite ultrafine particles produced by the use of a 50 atomic % Al-50 atomic % Y binary alloy.
Figure 4:
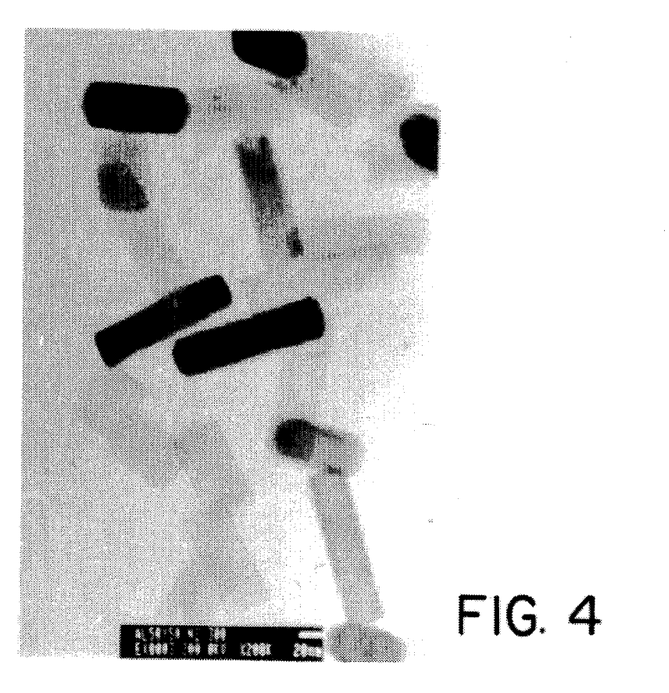
FIG. 4 is a transmission electron micrograph obtained at a second magnification of composite ultrafine particles produced by the use of a 50 atomic % Al-50 atomic % Y binary alloy.
Figure 5:
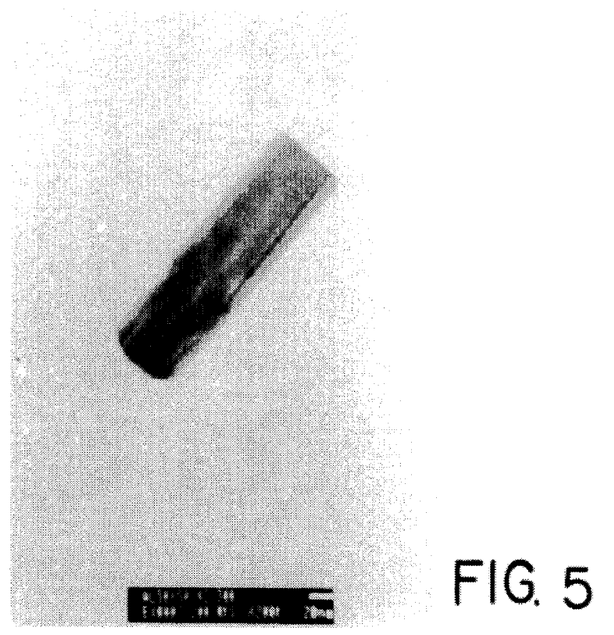
FIG. 5 is a transmission electron micrograph of a single ultrafine particle produced by the use of a 50 atomic % Al-50 atomic % Y binary alloy.
Figure 6:
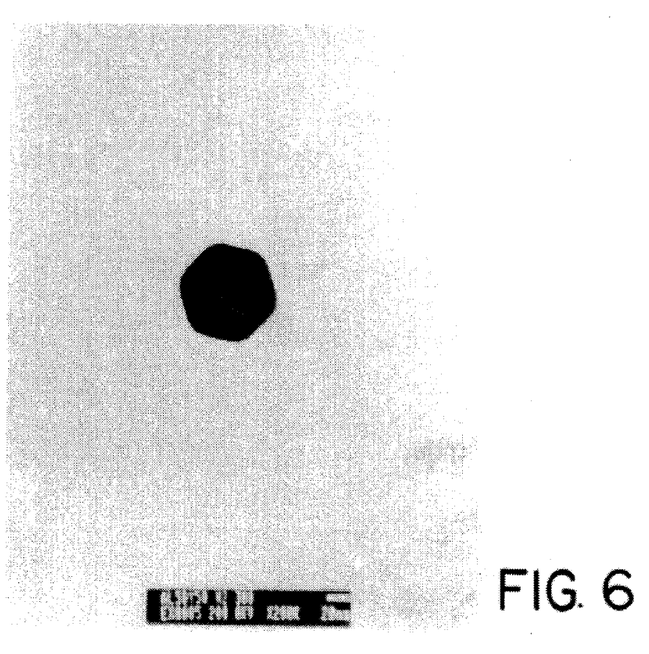
FIG. 6 is a transmission electron micrograph of composite ultrafine particles showing a particle of hexagonal shape in cross-section.

FIG. 2 shows X-ray diffraction patterns of the varying kinds of ultrafine particles obtained as described above. It is clearly noted from FIG. 2 that the two kinds of ultrafine particles produced by using the binary alloys of 25 at % Al-75 at % Y and 50 at % Al-50 at % Y as a matrix alloy had a composite phase of aluminum nitride and yttrium nitride and contained no metallic aluminum, whereas the ultrafine particles produced by using the binary alloy of 75 at % Al-25 at % Y as a matrix alloy contained metallic aluminum. It is further noted from the data that the content of aluminum nitride decreased and the content of yttrium nitride increased in proportion as the proportion of Y increased.

Transmission electron micrographs obtained of the composite ultrafine particles produced by using the binary alloy of 50 at % Al-50 at % Y are shown in FIGS. 3 to 6. It is found from these photographs that literally ultrafine composite particles which measured not more than 0.1 μm in diameter and comprised morphologically anisotropic particles of the shape of hexagonal columns or strips 50 to 100 nm in width (thickness) and 100 to 1,000 nm in length and morphologically isotropic particles 20 to 200 nm in diameter were produced. The anisotropic particles were found to contain yttrium at a concentration of 5 to 10 atomic % and, based on the results of electron beam diffraction measurement, confirmed to comprise an aluminum nitride monophase. The other isotropic particles were found to comprise yttrium nitride (spheres or regular rectangles) and aluminum nitride (spheres or regular hexagons) containing no yttrium.

Figure 7:
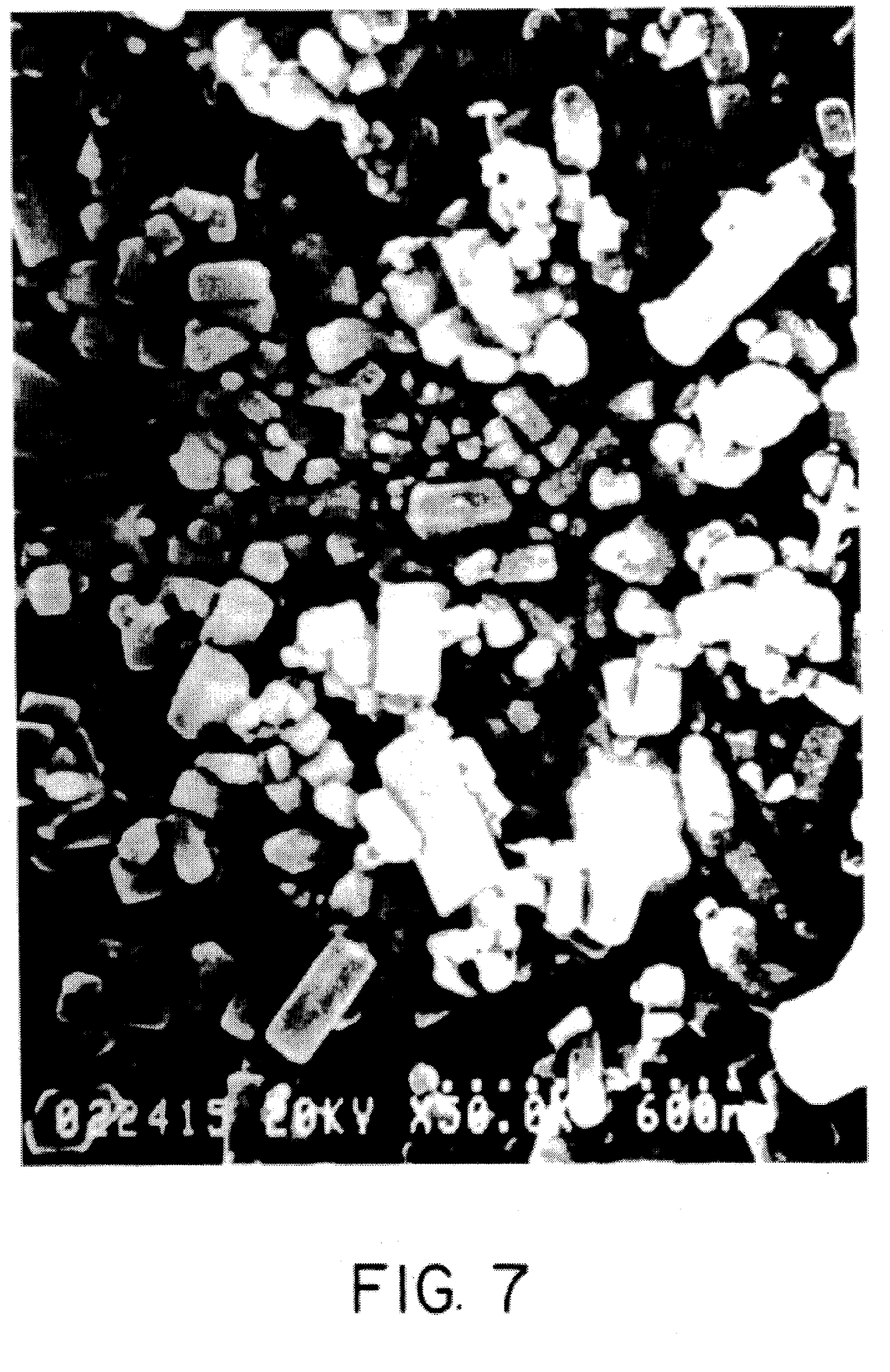
FIG. 7 is a scanning electron micrograph obtained of composite ultrafine particles produced by the use of a 50 atomic to Al-50 atomic % Y binary alloy.

FIG. 7 is a scanning electron micrograph of composite ultrafine particles produced by the use of a binary alloy of 50 at % Al-50 at % Y. It is clearly noted from this photograph that the composite ultrafine particles consequently obtained comprised a large amount of morphologically anisotropic particles of the shape of hexagonal columns or strips 50 to 100 nm in width (thickness) and 100 to 500 nm in length and morphologically isotropic particles 20 to 100 nm in diameter.

Figure 8:
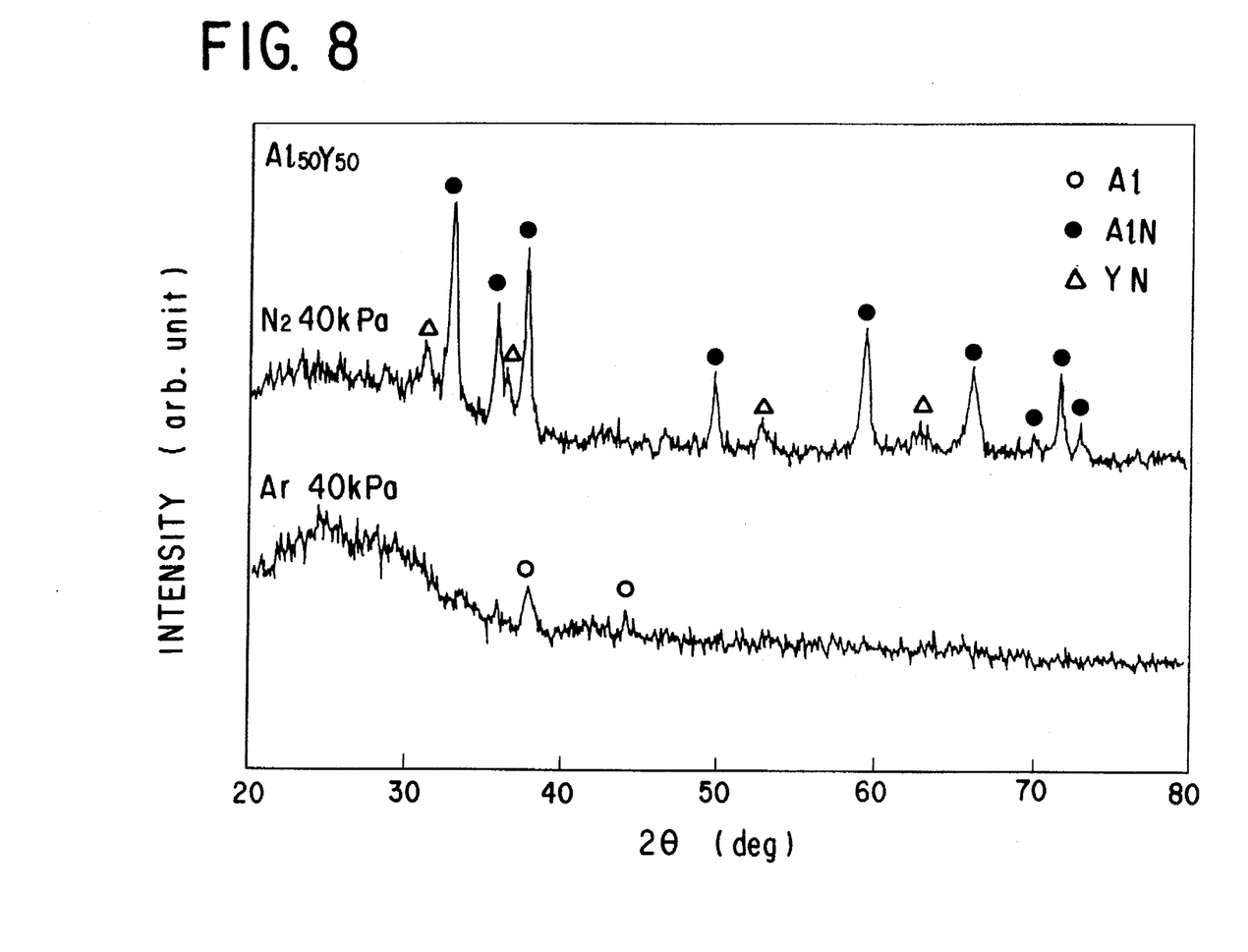
FIG. 8 is a diagram showing X-ray diffraction patterns of ultrafine particles produced by the use of a 50 atomic % Al-50 atomic % Y binary alloy severally in an atmosphere of nitrogen and in an atmosphere of argon gas invariably at 40 kPa.

FIG. 8 shows X-ray diffraction patterns of two kinds of ultrafine particles produced by the use of a binary alloy of 50 at % Al-50 at % Y respectively in an atmosphere of nitrogen and an atmosphere of argon gas invariably at 40 kPa. It is clearly noted from this diagram that in the ultrafine particles produced by the use of the atmosphere of nitrogen, aluminum and yttrium were perfectly nitrided.

Figure 9:
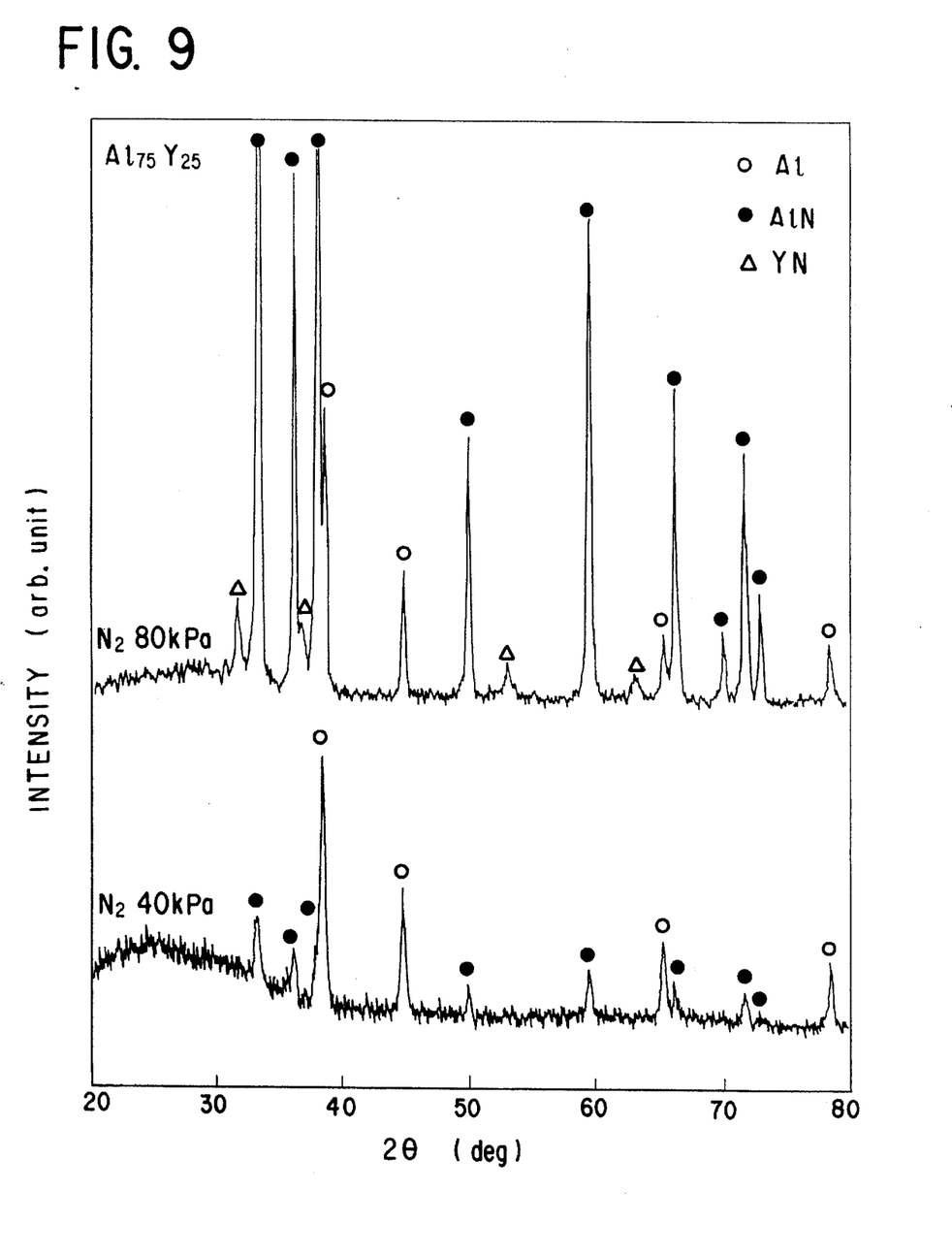
FIG. 9 is a diagram showing X-ray diffraction patterns of ultrafine particles produced by the use of a 75 atomic % Al-25 atomic % Y binary alloy in atmospheres of nitrogen severally at 40 kPa and 80 kPa.

FIG. 9 shows X-ray diffraction patterns obtained of two kinds of ultrafine particles produced by the use of a binary alloy of 75 at % Al-25 at % Y in atmospheres of nitrogen at 40 kPa and 80 kPa respectively. It is clearly noted from this diagram that the difference in nitrogen gas pressure brought about a discernible difference in the proportions of Al, Al N, and YN to be produced, namely that the ease with which aluminum nitride was produced increased in proportion as the nitrogen gas pressure increased.

Figure 10:
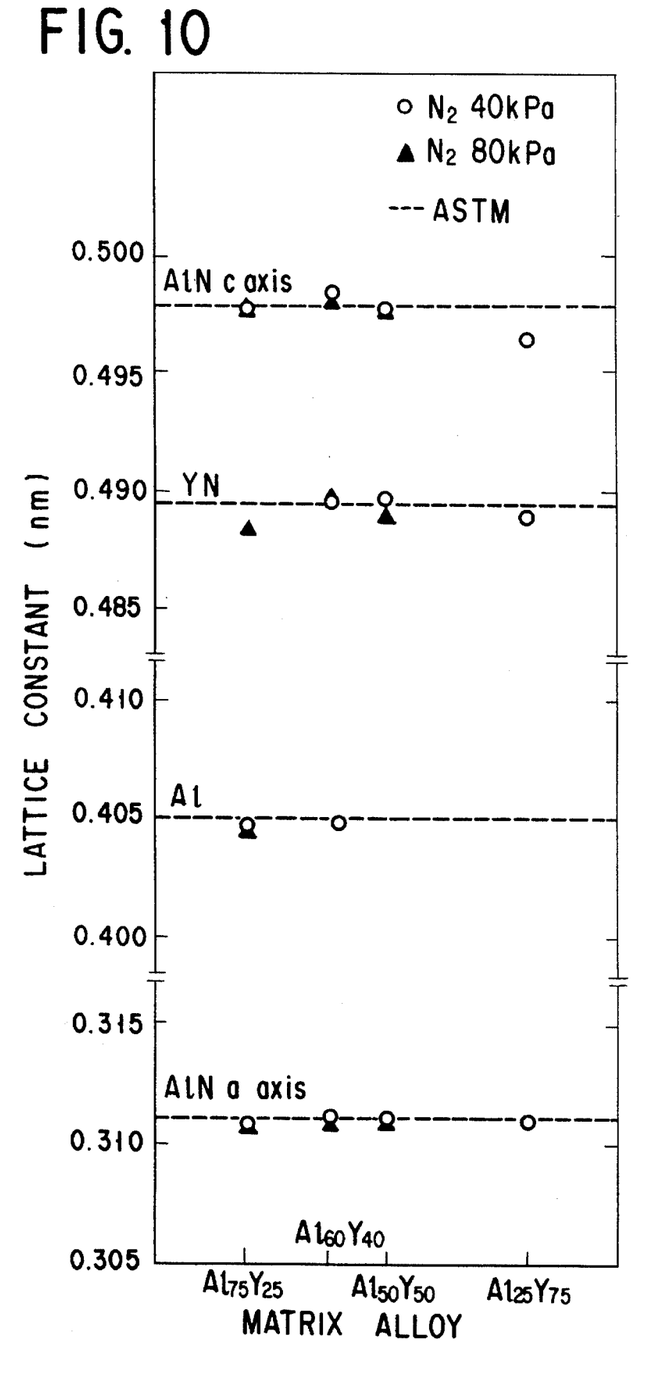
FIG. 10 is a diagram showing lattice constants of ultrafine particles produced by using varying matrix alloy compositions and nitrogen gas pressures.

FIG. 10 shows lattice constants of products obtained from matrix alloys of varying composition at varying nitrogen gas pressure. It is clearly noted from this diagram that for the purpose of producing composite ultrafine particles containing no metallic aluminum, it is proper to use a binary Al—Y alloy having an Al content of not more than 60 atomic % and that it is necessary to heighten the gas pressure of the nitrogen atmosphere in proportion as the Al content increases.

EXAMPLE 2

Composite ultrafine particles comprising aluminum nitride and the nitride of a varying rare earth element were obtained by arc melting (DC 200 A) binary alloys of 50 at % Al-50 at % Nd, 50 at % Al-50 at % Ce, and 50 at % Al-50 at % La in an atmosphere formed exclusively of nitrogen gas. The arc melting of each alloy was carried out while supplying the nitrogen gas into a vacuum chamber at a flow rate of 10 liters per minute and the produced ultrafine particles were blown to a substrate by the stream of nitrogen gas through a nozzle and deposited thereon. The matrix alloy had been previously prepared by melting metallic aluminum and each rare earth element by an electric arc and uniformly alloying the melt in an atmosphere of argon in the same vacuum chamber that was used subsequently in the production of ultrafine particles in the atmosphere of nitrogen.

Figure 11:
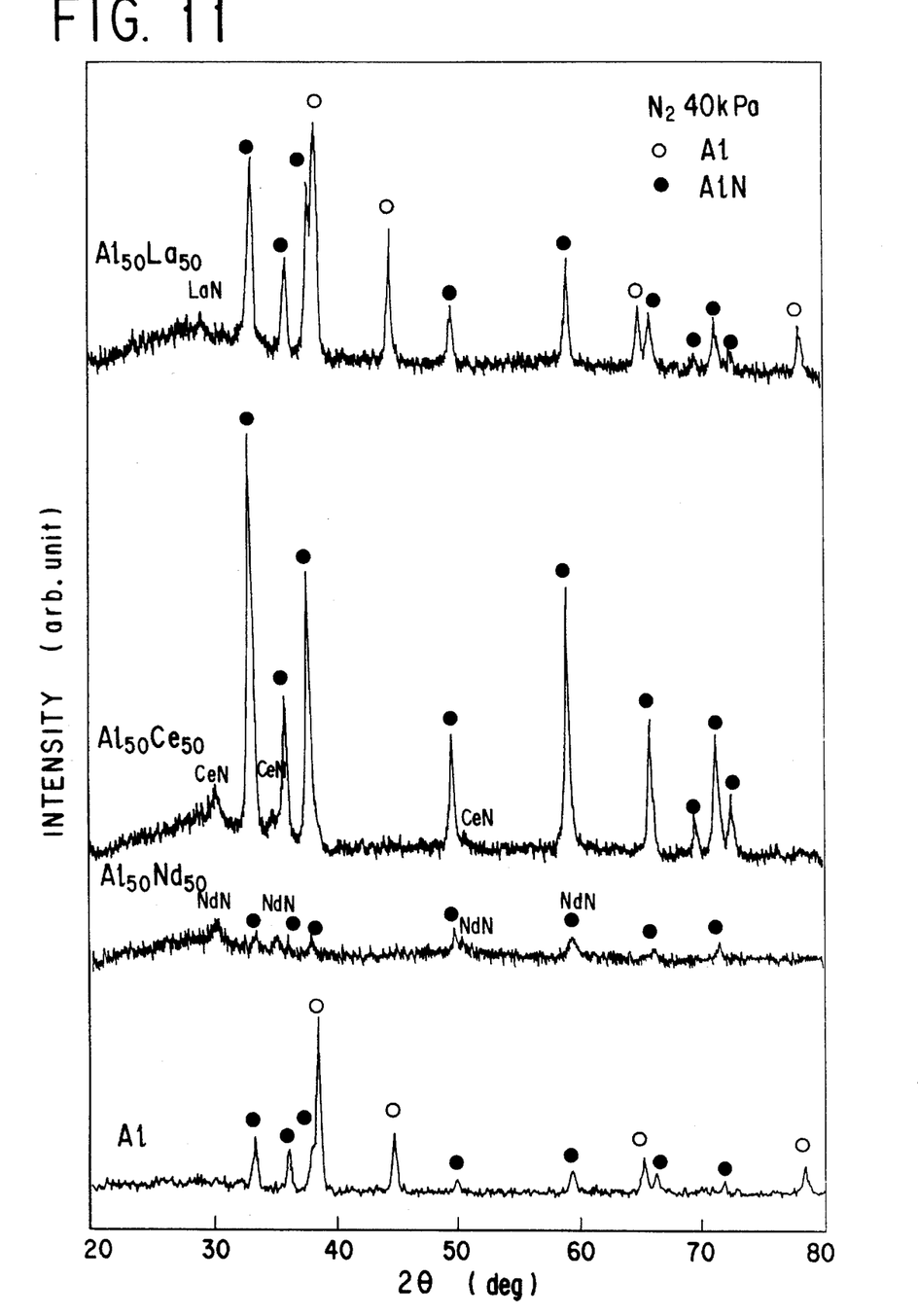
FIG. 11 is a diagram showing X-ray diffraction patterns of ultrafine particles produced by using 50 atomic % Al-50 atomic % Nd, 50 atomic % Al-50 atomic % Ce, and 50 atomic % Al-50 atomic % La binary alloys respectively as well as metallic aluminum.

FIG. 11 shows X-ray diffraction patterns of the varying ultrafine particles produced as described above. It is clearly noted from FIG. 11 that the ultrafine particles produced by using the binary alloys of 50 at % Al-50 at % Nd and 50 at % Al-50 at % Ce as a matrix alloy were composite ultrafine particles comprising morphologically anisotropic ultrafine particles of aluminum nitride and ultrafine particles of neodymium nitride or ultrafine particles of cerium nitride and containing no metallic aluminum. When the binary alloy of 50 at % Al-50 at % La was used as a matrix alloy, the ultrafine particles consequently produced contained ultrafine metallic aluminum particles besides ultrafine particles of aluminum nitride and ultrafine particles of lanthanum nitride. It was found that when lanthanum was used as a rare earth element, perfect nitriding of metallic aluminum could not be obtained unless the lanthanum content was increased to 60 atomic % or more.

Figure 12:
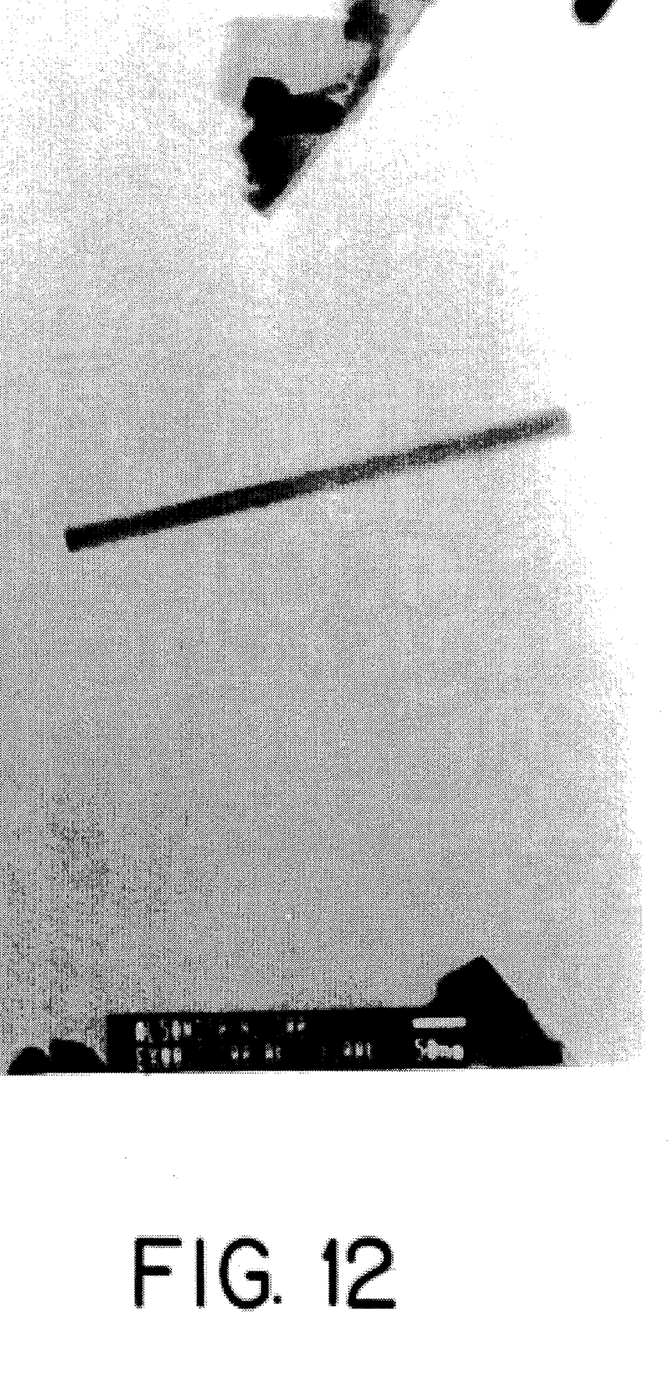
FIG. 12 is a transmission electron micrograph of composite ultrafine particles produced by the use of a 50 atomic % Al-50 atomic % Nd binary alloy.

FIG. 12 is a transmission electron micrograph of composite ultrafine particles produced by the use of a binary alloy of 50 at % Al-50 at % Nd (nitrogen gas pressure: 40 kPa). It is clearly noted from this photograph that the ultrafine particles aluminum nitride consequently produced were very slender and in the shape of whiskers approximately measuring 20 nm in diameter and 500 nm in length. The ultrafine particles of the shape of whiskers were found by analysis to be single crystals of aluminum nitride which were grown in the direction of the c axis of the aluminum nitride crystals.

It is clear from the working examples cited above that the method of the present invention attains a notably high nitriding ratio and, unlike the conventional method, avoids the disadvantage of inevitably entailing production of a large amount of ultrafine particles of metallic aluminum in addition to ultrafine particles of aluminum nitride. Further, it can produce composite ultrafine particles which comprise ultrafine particles of aluminum nitride including morphologically anisotropic particles of the shape of substantially hexagonal columns, strips, or whiskers whose aspect ratio is not less than 1 and ultrafine particles of the nitride of a rare earth element.

While certain specific working examples have been disclosed herein, the invention may be embodied in other specific forms without departing from the spirit or essential characteristics thereof. The described examples are therefore to be considered in all respects as illustrative and not restrictive, the scope of the invention being indicated by the appended claims rather than by foregoing description and all changes which come within the meaning and range of equivalency of the claims are, therefore, intended to be embraced therein.

What is claimed is:

1. Composite ultrafine particles comprising:

(A) ultrafine particles of aluminum nitride having a morphologically anisotropic structure, said particles having a shape and size selected from the group consisting of (a) a hexagonal column or whisker 5 to 200 nm in width or thickness and 50 to 1,000 nm in length and (b) a strip 5 to 50 nm in thickness and 10 to 1,000 nm in width or length, and said particles substantially comprising any one of a composite phase of aluminum nitride and nitride of a rare earth element, a solid solution of rare earth element in aluminum nitride, and a single crystal of aluminum nitride; and (B) ultrafine particles of nitride of the rare earth element.

2. Composite ultrafine particles according to claim 1, wherein said nitride of the rare earth element is selected from the group consisting of yttrium nitride, lanthanum nitride, cerium nitride, neodymium nitride, scandium nitride, gadolinium nitride and terbium nitride.

3. Composite ultrafine particles according to claim 1, wherein said nitride of the rare earth element is yttrium nitride.

4. An aggregate of composite ultrafine particles comprising:

(A) ultrafine particles of aluminum nitride having a morphologically anisotropic structure, said particles having a shape and size selected from the group consisting of (a) a hexagonal column or whisker 5 to 200 nm in width or thickness and 50 to 1,000 nm in length and (b) a strip 5 to 50 nm in thickness and 10 to 1,000 nm in width or length, and said particles substantially comprising any one of a composite phase of aluminum nitride and nitride of a rare earth element, a solid solution of rare earth element in aluminum nitride, and a single crystal of aluminum nitride; and (B) ultrafine particles of nitride of the rare earth element mixed with said ultrafine particles of aluminum nitride.

5. An ultrafine particle of aluminum nitride having a morphologically anisotropic structure, which particle having a shape of strip 5 to 50 nm in thickness and 10 to 1,000 nm in width or length, said ultrafine particle of aluminum nitride containing a rare earth element or nitride of said rare earth element therein.

6. An ultrafine particle of aluminum nitride according to claim, 5 wherein said rare earth element is yttrium.

7. An ultrafine particle of aluminum nitride having a morphologically anisotropic structure, which particle having a shape of hexagonal column 5 to 200 nm in width or thickness and 50 to 1,000 nm in length, said ultrafine particle of aluminum nitride containing a rare earth element or nitride of said rare earth element therein.

8. An ultrafine particle of aluminum nitride according to claim 7, wherein said rare earth element is yttrium.

9. An ultrafine particle of aluminum nitride having a morphologically anisotropic structure, which particle having shape of whisker 5 to 200 nm in width or thickness and 50 to 1,000 nm in length, said ultrafine particle of aluminum nitride being a single crystal of aluminum nitride.

* * * * *

UNITED STATES PATENT AND TRADEMARK OFFICE
CERTIFICATE OF CORRECTION

PATENT NO. : 5,468,697
DATED : November 21, 1995
INVENTOR(S) : Tadashi YAMAGUCHI et al It is certified that error appears in the above-indentified patent and that said Letters Patent is hereby corrected as shown below:

Claim 9, Column 12, Line 10, before "shape", insert --a--.

Signed and Sealed this

Twenty-fourth Day of September, 1996

Attest:

BRUCE LEHMAN

Attesting Officer     Commissioner of Patents and Trademarks